United States Patent
Mohd Arshad et al.

(10) Patent No.: US 9,141,157 B2
(45) Date of Patent: Sep. 22, 2015

(54) MOLDED POWER SUPPLY SYSTEM HAVING A THERMALLY INSULATED COMPONENT

(75) Inventors: Mohamed Ashraf Mohd Arshad, Kuala Lumpur (MA); Jin Keong Lim, Kuala Lumpur (MA)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 288 days.

(21) Appl. No.: 13/272,698

(22) Filed: Oct. 13, 2011

(65) Prior Publication Data

US 2013/0094169 A1 Apr. 18, 2013

(51) Int. Cl.
*H05K 1/16* (2006.01)
*G06F 1/20* (2006.01)
*H01L 23/373* (2006.01)
*H01L 23/42* (2006.01)

(52) U.S. Cl.
CPC .............. *G06F 1/203* (2013.01); *H01L 23/373* (2013.01); *H01L 23/42* (2013.01); *H01L 2924/0002* (2013.01)

(58) Field of Classification Search
CPC ............. H05K 3/02; H05K 3/04; H05K 3/28; H05K 3/38; H01L 23/12; H01L 23/13; H01L 23/15; H01L 23/28; H01L 23/29; H01L 23/31; H01L 23/34; H01L 23/49; H01L 23/495; H01L 33/00; C08G 59/00; C08G 59/08; C08G 59/62
USPC ............ 174/260, 259, 521, 536, 538; 257/79, 257/686, 778, 673, 676; 428/383, 622, 458, 428/447; 336/83, 200, 205
See application file for complete search history.

(56) References Cited

U.S. PATENT DOCUMENTS

| | | | | |
|---|---|---|---|---|
| 4,293,624 A | * | 10/1981 | Buckley | 430/5 |
| 4,554,038 A | * | 11/1985 | Allard | 156/196 |
| 4,710,797 A | * | 12/1987 | Tanaka | 257/681 |
| 4,801,501 A | * | 1/1989 | Harlow | 428/383 |
| 4,835,065 A | * | 5/1989 | Sato et al. | 428/622 |
| 5,162,140 A | * | 11/1992 | Taniguchi | 428/41.1 |
| 5,178,957 A | * | 1/1993 | Kolpe et al. | 428/458 |
| 5,212,017 A | * | 5/1993 | Meder | 428/447 |
| 5,368,805 A | * | 11/1994 | Motai | 264/272.15 |
| 5,391,916 A | * | 2/1995 | Kohno et al. | 257/676 |
| 5,536,970 A | * | 7/1996 | Higashi et al. | 257/676 |
| 5,708,128 A | * | 1/1998 | Oikawa et al. | 528/353 |
| 6,060,756 A | * | 5/2000 | Machida et al. | 257/415 |
| 6,064,111 A | * | 5/2000 | Sota et al. | 257/667 |
| 6,150,456 A | * | 11/2000 | Lee et al. | 524/606 |
| 6,228,688 B1 | * | 5/2001 | Ohta et al. | 438/127 |
| 2002/0039001 A1 | * | 4/2002 | Nagai et al. | 313/512 |
| 2002/0074936 A1 | * | 6/2002 | Yamazaki et al. | 313/504 |
| 2003/0024723 A1 | * | 2/2003 | Igarashi et al. | 174/52.1 |

(Continued)

*Primary Examiner* — Xiaoliang Chen
(74) *Attorney, Agent, or Firm* — Steven A. Shaw; Frank D. Cimino

(57) ABSTRACT

A molded system (100) has a plurality of components (110, 120, 130) attached to a carrier (101), one of the components being an object (110) of irregular thermal capacitance. For example, carrier (101) may be a QFN/SON-type leadframe and object (110) an inductor of high thermal capacitance. The surface of the object is sealed with a hardened polymeric layer (220) of high thermal resistance, whereby the layer (220) thermally insulates the object (110) and inhibits the transport of thermal energy between the object and the system. System (100) has molding compound (140) encapsulating the carrier and the attached components including the object (110) and the polymeric layer sealing the object's surface.

11 Claims, 3 Drawing Sheets

(56) References Cited

U.S. PATENT DOCUMENTS

| | | | |
|---|---|---|---|
| 2003/0071340 A1* | 4/2003 | Derderian | 257/686 |
| 2003/0178716 A1* | 9/2003 | Maeda et al. | 257/686 |
| 2003/0203111 A1* | 10/2003 | Zhuang et al. | 427/250 |
| 2004/0070083 A1* | 4/2004 | Su | 257/778 |
| 2004/0089928 A1* | 5/2004 | Nakajima et al. | 257/678 |
| 2004/0104391 A1* | 6/2004 | Maeda et al. | 257/79 |
| 2004/0207082 A1* | 10/2004 | Yamano et al. | 257/738 |
| 2005/0042958 A1* | 2/2005 | Namikawa et al. | 442/76 |
| 2005/0096429 A1* | 5/2005 | Lee et al. | 525/178 |
| 2006/0019102 A1* | 1/2006 | Kanakarajan | 428/423.1 |
| 2007/0044910 A1* | 3/2007 | Kuo et al. | 156/307.3 |
| 2007/0225438 A1* | 9/2007 | Hasegawa et al. | 524/879 |
| 2008/0176984 A1* | 7/2008 | Hwang et al. | 524/404 |
| 2009/0102029 A1* | 4/2009 | Tadaoka | 257/673 |
| 2009/0241872 A1* | 10/2009 | Wang et al. | 123/90.11 |

* cited by examiner

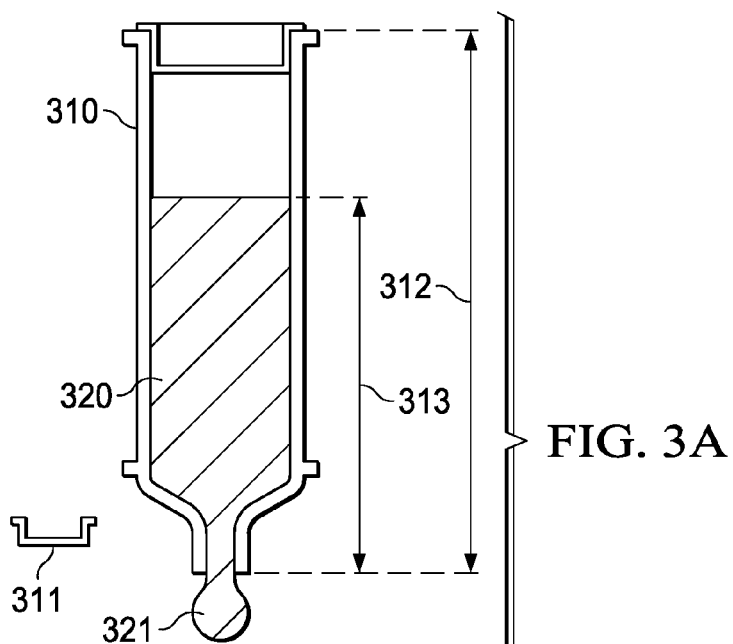
FIG. 3A
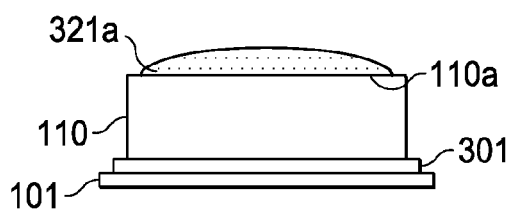
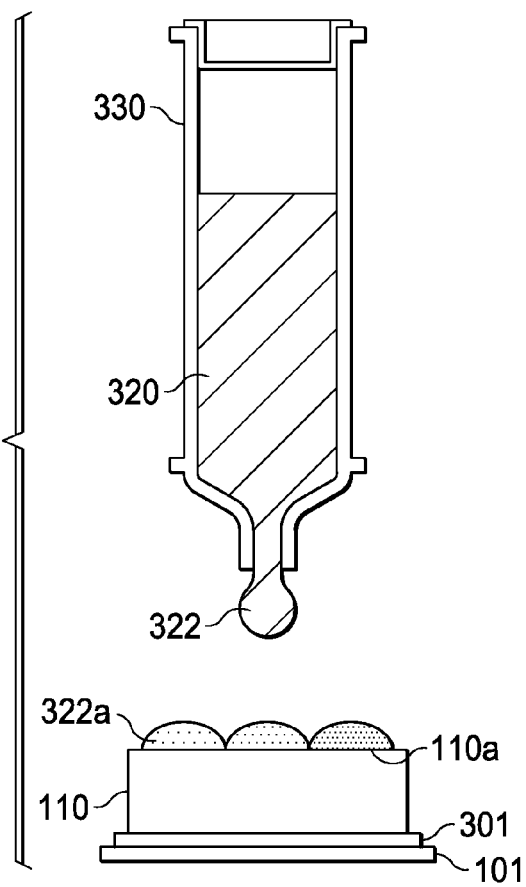
FIG. 3B

MOLDED POWER SUPPLY SYSTEM HAVING A THERMALLY INSULATED COMPONENT

FIELD OF THE INVENTION

The present invention is related in general to the field of semiconductor devices and processes, and more specifically to structure and fabrication method of a molded multi-component electronic system including a thermally insulated object of irregular thermal capacitance.

DESCRIPTION OF RELATED ART

Electronic products in commercial applications such as telecom, home audio, and regulator products often need systems, which can switch power supplies, regulate and stabilize voltages, and work as dc-dc converters. These systems not only need to have high efficiency to operate properly, but should preferably also have small dimensions and very low cost. As an example of a system, popular power switches involve a rectangular metal leadframe of 15 by 9 mm outline, on which a plurality of discrete electronic components are assembled and then, as a unit, overmolded with a plastic encapsulation compound by a transfer molding technique. The height of the overmolded power system is between 2.6 and 2.8 mm. The components may include a wire-bonded and packaged MOS Field Effect Transistors (FET) with low resistance and large current handling capability; an assortment of resistors and capacitors; and a packaged inductor.

For the volume of the packaged power supply system, the dominant component is the packaged inductor. The inductor includes a coil of copper wire wrapped around a core of ferrite, which is a somewhat porous material including interstitial spaces filled with air. The inductor is encapsulated by a packaging compound, which has cuboid shape and, in one product family, the dimensions 7.25 by 6.8 mm and a height of 2.3 mm.

The leadframe used to assemble the components is a QFN-type leadframe (Quad Flat No-Lead), which is first etched partially so that the thinner portions can function as elongated cantilever-like leads to serve as assembly places for the electronic components, while a plurality of spots are allowed to remain un-etched as thicker portions to become soldering pads exposed from the final encapsulation. The assembly is in most cases an attachment step by soldering and thus involves some mechanical pressure. Consequently, the step of assembling and soldering the components on the thin leads requires physical support and stabilization of the leads. This requirement is conventionally achieved by additional supporting features such as bumps and pads, which are also left un-etched in strategic locations of the leads during the step of half-etching the leads. In the process step of encapsulating the system, these bumps and pads remain exposed from the final encapsulation.

In the most popular encapsulation method, the assembled leadframes are overmolded by a transfer molding technique in a polymeric compound including a thermoset resin (epoxy novolac, diglycidyl ether of bisphenol-Al), hardeners, accelerators, flame retardants, and inorganic fillers selected for reducing shrinkage, controlling viscosity, lowering the coefficient of expansion, increasing thermal conductivity, and increasing mechanical strength. Before polymerization, the compound is heated to a pre-determined temperature range (typically 160 to 180° C.), which lowers the viscosity so that the compound can be pressured through a gate into a pre-heated mold cavity loaded with the leadframe and the component assembly. The compound fills the cavity by progressing in a uniform front from the gate throughout the cavity; the displaced air is expelled through a vent. For the whole process, only few seconds (typically 10 to 20 s) are available (dependent on the compound) before the resin starts polymerizing and thus hardening. While increasing the temperature range would reduce the viscosity, the increase would also substantially narrow the time window before the onset of polymerization and hardening. After filling the cavity, a packing pressure is maintained for a preset duration to partially polymerize and harden before the mold is opened; thereafter, the molded device is fully polymerized and hardened for several hours in an oven at elevated temperature.

SUMMARY OF THE INVENTION

Applicants recognized that widespread applications of power supply systems in markets as diverse as handheld, laptop, automotive, and medical products require system packages, which are extremely thin yet still offer thermal and electrical efficiencies close to the theoretical maximum. After selecting inductors with small heights without compromising device performance, applicants observed during efforts to reduce the thickness of the molding compound that encapsulated power systems showed frequent failures by delamination of the cured molding compound from the encapsulated inductors. Failure analysis revealed voids of about 0.2 to 0.3 mm width in the molding compound layer, which had a thickness between 0.25 and 0.30 mm above the inductor package.

Air bubbles might get prominently formed at physical obstacles to the progressing front of the molding compound, for example at the voluminous inductor; they are readily squashed or expelled by low-viscosity compound. In a detailed analysis, applicants discovered that the root cause of the observed void formation was the high thermal capacitance of the inductor, determined by its ferrite content and copper coil. The high thermal capacitance can locally increase the temperature of the by-flowing molding compound and thereby shorten the window of the molding process and prematurely initiate the polymerization process. Since molding compound becomes harder in the polymerization process, it can no longer squash or expel a trapped air bubble as a pre-polymerized compound can. Consequently, the trapped air bubble can cause a void in a thin compound layer.

Applicants solved the problem of void formation by preventing a shortening of the time window for the transfer molding process. They introduced a coat, which thermally isolates the inductor as the object of high thermal capacity from the by-flowing molding compound. As a consequence, the inductor is disabled to influence the temperature of the progressing molding compound. A preferred coat comprises a thin polymeric layer of high thermal resistivity. A suitable material is a thermoset epoxy-based polymer with 200 to 500 times higher thermal resistivity than metals. In an exemplary material, the thermal conductivity may be 1.0 $Wm^{-1}K^{-1}$.

In this example, it is a technical advantage that the thermal insulation can be applied without investing new funds in expensive equipment, since a polymeric layer can be formed as a thin meniscus, or as a coherent array of overlapping dots, on the surface of the packaged inductor assembled on the leadframe. After deposition, the polymeric layer is fully polymerized (hardened) by an additional curing step, before the transfer overmolding process begins for the system.

One embodiment of the invention is a method for molding a system including an object having irregular thermal capacitance. The method comprises the step of sealing the surface of the object having irregular thermal capacitance with a polymeric layer having high thermal resistance, thus thermally insulating the object; and then the step of molding over the sealed surface to encapsulate the object and the system in a molding compound.

Another embodiment of the invention is a molded power supply system, which comprises a QFN/SON-type leadframe; a plurality of power transistors and electronic components assembled on the leadframe, wherein at least one component is thermally sealed by an overcoat of a thermally insulating thermoset material; and a package encapsulating the assembled components into a thermoset molding compound.

BRIEF DESCRIPTION OF THE DRAWINGS

FIG. 1 depicts the package material overmolding the system as transparent.

FIGS. 3A and 3B show exemplary methods of depositing the thermoset resin by a glue dispenser.

DETAILED DESCRIPTION OF THE PREFERRED EMBODIMENTS

Figure 1:
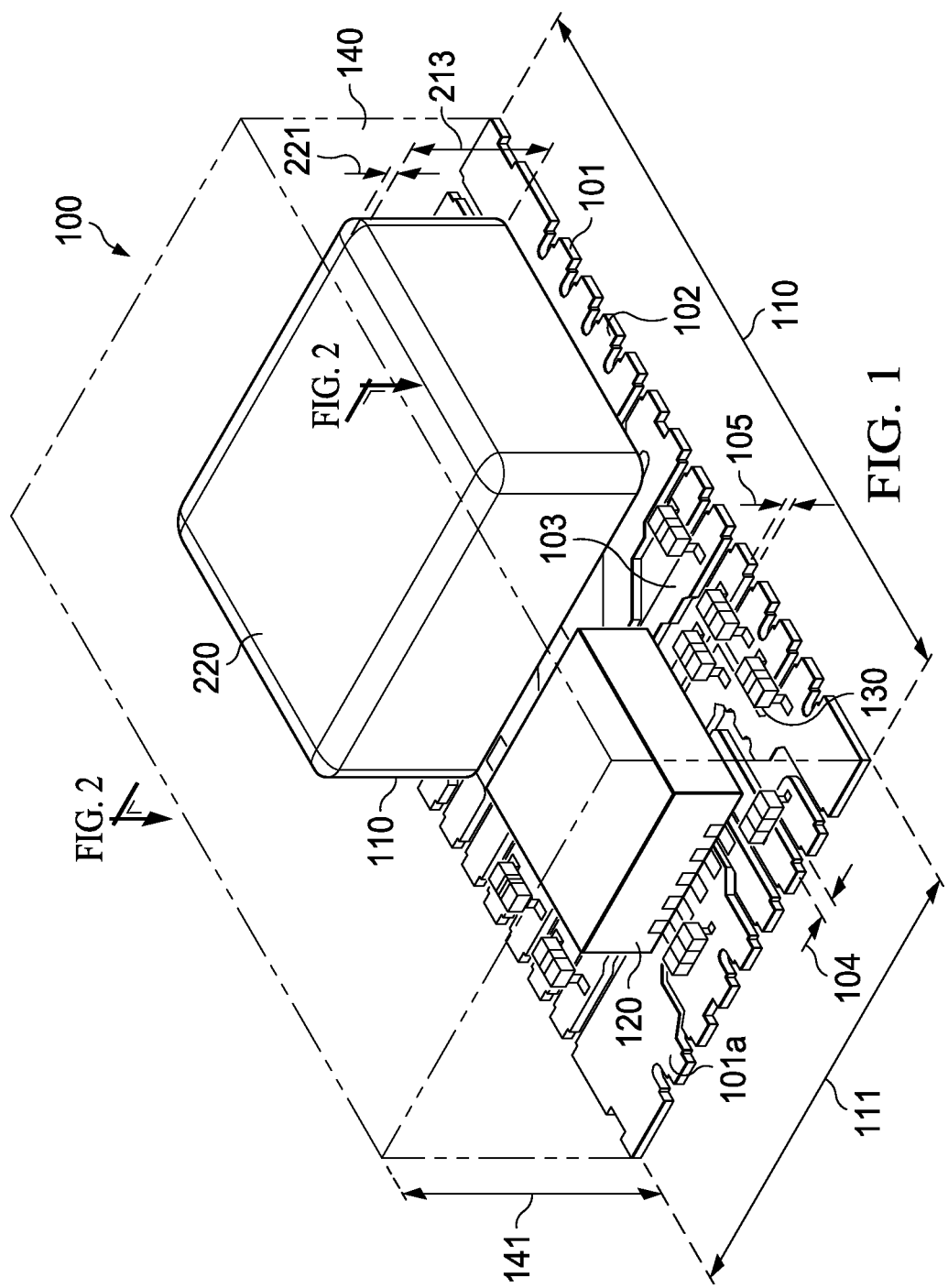
FIG. 1 illustrates a perspective top view of an exemplary packaged electronic system as an embodiment of the invention, wherein the system has a QFN/SON-type leadframe with elongated leads and a thermally insulating coat over the object of irregular thermal capacitance. For clarity purpose.

FIG. 1 displays a perspective top view of an exemplary packaged electronic system generally designated 100. The system is based on a QFN/SON-type metal leadframe 101, preferably made of copper or a copper alloy. As FIG. 1 further shows, system 100 includes a plurality of electronic components assembled on the leadframe surface 101a facing the inside of system 100. The components include an inductor 110 encapsulated in its own housing, a packaged power integrated circuit 120 (frequently a wire bonded IC), also in its own housing, and a plurality of resistors and capacitors 130. These components are conductively attached to lead locations remote from the periphery, preferably by soldering, so that the flat ends 102 of the respective leads can provide the connections to external parts. By virtue of their attachment to the leads, the components bridge the gaps 104 between adjacent leads and thus act mechanically stabilizing and strengthening.

System 100 of FIG. 1 further includes packaging compound 140, which encapsulates surface 101a of the leadframe together with the components assembled on the leadframe. For clarity purpose, compound 140 is depicted transparent in FIG. 1; in actual systems 100, however, compound 140 is preferably an epoxy-based molding material and thus not permeable to visible light. As an example, the thickness 141 of the molded system 100 may be in the range from about 2.6 to 2.8 mm. The arrows of FIG. 1 indicate where the cutaway is administered, which creates the cross section of system 100 depicted in FIG. 2.

Leadframe 101 has, like generally in Quad Flat No-Lead (QFN) and Small Outline No-Lead (SON) devices, no metallic leads shaped as cantilevers protruding from the device package; rather, the metallic contacts for electrical connection and for board attach (by pressure or soldering) are provided by flat metal pads. As FIG. 1 indicates, the lead ends 102, shaped as flat pads, are arrayed along the periphery of leadframe 101. The lead ends 102 belong to metal leads 103, which are elongated and extend from the periphery towards the center region of the leadframe. Adjacent elongated leads 103 are spaced by gaps 104. The lead ends 102, shaped as flat pads, are arrayed along the periphery of leadframe 101. The leads ends have a pitch center-to-center of about 0.9 mm; adjacent leads are spaced apart by gaps about 0.4 mm wide.

Figure 2:
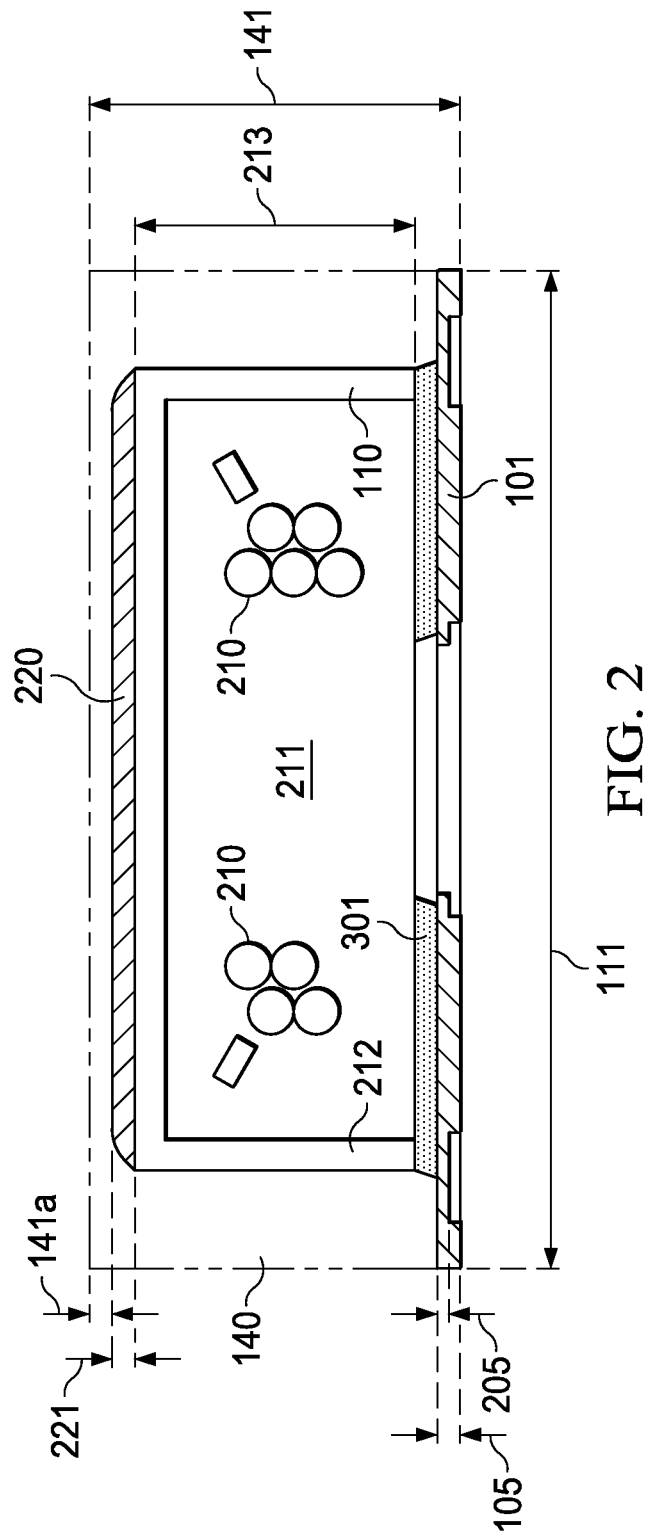
FIG. 2 depicts a cross section through the system of FIG. 1 along the cutaway lines indicated in FIG. 1.

The leads of the exemplary leadframe are formed by stamping or etching from a metal sheet in the starting thickness 105 range from 120 to 250 µm; thinner or thicker metal sheets may be used. Without the rails, the length 110 of the leadframe is about 15 mm, and the width 111 about 9 mm. The metal is preferably copper or copper alloy; alternatively, the leadframe metal may be aluminum or aluminum alloy, an iron-nickel alloy, or Kovar™. As indicated in FIG. 2, after the features including the lead contours are formed, portions of the leadframe, especially portions of the leads, are further etched to reduce the thickness about 50% from its original value 105 to a diminished value 205, while other portions (the peripheral lead ends and the soldering pads) maintain the original thickness 105. A leadframe including two distinct lead thicknesses is often referred to as a half-etched leadframe.

The epoxy-based compound 140 used for overmolding system 100 in a transfer molding technique is preferably a multi-aromatic resin polymer with about 90% silica fillers. The compound is a thermoset material. Such compounds are commercially available, for example from Sumitomo Bakelite company, Japan. The molding equipment used is a precision steel mold, for instance an ASM Osprey steel mold. The bottom mold half includes the runners, gates and cavities; the top mold half can be closed and opened. The precision gates are configured to control a balanced front of the polymer compound when it progresses through the cavity. This is especially true when the cavity is loaded for overmolding with assemblies of standard semiconductor devices. The balanced front further ensures that air trapped in the cavity can be pressured and purged through the vent at the end of the transfer cycle.

As the assembly of FIG. 1 illustrates, the variety of components on leadframe 101 represent a challenging obstacle course for maintaining a balanced front in molding compound, when it enters from the gate and progresses through the cavity. Especially the voluminous body of inductor 110 has a tendency to impede the compound flow and cause an unbalanced, non-laminar front liable to trap air. If the volume of the trapped air is not too large, the packing pressure, especially towards the end of the transfer cycle, can collapse and purge the bubble completely, leaving no void in the encapsulation. On the other hand, if the molding compound is beginning to reach the end of the process window and starts to gel (harden), the trapped air may not be completely collapsed and expelled, and a void in the encapsulation may remain.

For the compound quoted, the molding temperature is about 175° C. and the transfer time is about 14 s. After this time window, the compound starts to gel (polymerize) and harden. After the transfer, the polymerization (cure) time is about 90 s. After cool down to approximately ambient temperature, the mold is opened; transported to another oven, the compound of the molded system is fully polymerized (cured) for 4 h at 175° C.

As is typical for thermoset polymers, the time for the process window of reproducible molding, before onset of gel, is considerably shortened when the temperature is higher, even though the higher temperature lowers the viscosity of the polymer. If a temperature variation is only local, the disturbance of the process window may also only be local, but may still result locally in a premature hardening of the compound, endangering the overall reproducibility of the molding process. As stated above, any such irregular hardening of the compound may end up in a trapped air bubble and a void. A final exemplary inductor has an attachment area 7.25×6.8 mm and a height 213 of 2.2 mm.

The cross section depicted in FIG. 2 indicates some major features of inductor 110. The inductor includes a spirally configured coil of coated copper wire 210, welded to a plated copper leadframe, and molded into a magnetic ferrite material 211. The ferrite material is pressed at high pressure, cured, and encapsulated in a housing 212, which may be a hardened molding compound. Generally speaking, a ferrimagnetic material has high electrical resistivity, a spinel crystal structure, and the chemical formula $XFe_2O_4$, wherein X represents any divalent metal ion whose size is such that it will fit into the crystal structure. Due to its composition, inductor 110 has a high thermal capacity.

FIG. 2 further indicates a thermal coat 220 on the top surface of inductor 110 of height 213. Coat 220 is hidden under molding layer 141a with a thickness in the range from 0.2 to 0.3 mm. Coat 220 acts as a sealant to thermally isolate inductor 110 as the source of high thermal capacity from the by-flowing molding compound 140 when layer 141a is created. As a consequence, the thermal capacity of inductor 110 is inhibited to locally increase the molding temperature and to shorten the time window for the transfer molding process; a premature local hardening of the molding compound is thus prevented. Consequently, there is no interruption of squashing and expelling any incidental air bubble formed at the bulky inductor 110.

Preferably, the material of coat 220 is an epoxy-based polymer of low thermal conductivity. A preferred example is a polymer commercially available, for example, from Emerson & Cumming. The polymer has a thermal conductivity of $1.00\ Wm^{-1}K^{-1}$ @ 121° C., representing a thermal resistivity of 200 to 500 times the thermal resistivity of metals. Even a thickness 221 of layer 220 of about 0.4 mm or less is suitable to effectively thermally isolate an object of irregular thermal capacitance, such as the high thermal capacitance of inductor 110. In an analogous way, a layer of the coat material and similar thickness is suitable to thermally isolate an object of low thermal capacitance.

Other characteristics of the quoted exemplary polymer include a glass transition temperature of 124° C., a cure schedule of 2 hr @ 125° C. or 0.5 hr @ 150° C., a specific gravity (cured) of 2.1, a hardness of 92 shore D, and a volume resistivity of $1\times10^{16}$ Ωcm @ 100° C.

A preferred method of manufacturing the layer for coat 220 is the application of a glue dispenser, as illustrated in the examples of FIGS. 3A and 3B. Encapsulated inductor 110 is attached on leadframe 101 by solder layer 301. An exemplary syringe 310 of a height 312 (between 110 and 120 mm) is placed above surface 110a of inductor 110. The syringe is filled up to a height 313 with low-viscosity polymer 320 for coat 220. When cap 311 is removed from the orifice of the syringe, droplets 321 can form and eventually fall on surface 110a. Due to the low viscosity of polymer 320, the disposed droplet will spread on surface 110a, first forming a meniscus 321a as shown in FIG. 3A and then spreading to a layer-like coat 220 as indicated in FIG. 2. The spreading of polymer 320 on surface 110a is determined by the adhesion to the polymerized encapsulation of the inductor, and the final surface of coat 220 (see FIG. 2) is determined by the surface tension of polymer 320. The thickness of the coat is the average thickness across the area covered; the methods of FIGS. 3A and 3B, applied to the exemplary system of FIG. 1, can deliver a thickness of about 0.4 mm or less.

The layer-like coat of polymer 320 is cured (hardened) by a sequence of polymerization steps. For the preferred material quoted, the curing schedule includes 2 hours at 125° C., or by 0.5 hr at 150° C.

As an example for an alternative method, FIG. 3B depicts a syringe 330 with narrower nozzle, where smaller droplets 322 of polymer 320 can form. The smaller droplets are deposited in a dense regular grid array of meniscus 322a on surface 110a of inductor 110. Dependent on the adhesion to surface 110a and the surface tension of the polymer, the meniscus 322a will flow into each other, at least to some degree, and coagulate into a soft, semisolid coat. The final polymerization cycle is as described above at 2 hr @ 125° C. or 0.5 hr @ 150° C.

After fully curing (hardening) the coat layer 321a or 322a (layer 220 in FIG. 2), a transfer overmolding process can follow without delay so that the surface of the hardened coat layer remains substantially free of contamination. In the example of FIG. 1, the polymer employed in the overmolding process encapsulates the whole power supply system assembled on leadframe 101 together with the coated inductor 110. In this process, the overmolded layer on top of the coat layer has a preferred thickness between 0.25 and 0.3 mm; the market trend is to reduce this thickness further. The overmolded layer is in touch with the coat layer for the full extent of the coat area. In a large amount of systems fabricated, no voids have been observed in the overmolded layer, thanks to the thermal insulating property of the coat layer, which thermally insulates the thermal capacitance of the inductor.

It should be noted that an analogous thermal shielding effect can be achieved for an irregularity of the thermal capacitance, wherein the capacitance of the object-to-be-shielded could act as a sink of thermal energy, causing a decrease of the temperature of a by-flowing substance and thus distort the temperature distribution of a process.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies to a system of any number of components assembled on any substrate, with a molding compound encapsulating the system.

As another example, the invention applies to systems with more than one object of irregular thermal capacitance, either the object may act as a source of thermal energy or as a sink of thermal energy.

It is therefore intended that the appended claims encompass any such modifications or embodiments.

We claim:

1. Method for molding a system including an object having irregular thermal capacitance, comprising:
   depositing the polymer on the surface of the object while it is a low-viscosity resin so that surface tension pulls the deposited resin into a layer covering the surface uniformly;
   sealing the surface of the object having irregular thermal capacitance with a polymeric layer having high thermal resistance, thus thermally insulating the object; and
   then molding over the sealed surface to encapsulate the object and the system in a molding compound.

2. The method of claim 1 wherein the polymeric layer is a thermoset polymer.

3. The method of claim 2 further including, before molding, hardening the polymer.

4. The method of claim 3 wherein the molding compound touches the hardened polymer of the layer.

5. The method of claim 1 wherein the object having irregular thermal capacitance is able to act as a source of thermal energy.

6. The method of claim 1 wherein the object having irregular thermal capacitance is able to act as a sink of thermal energy.

7. The method of claim 3 wherein the thermoset polymer has a thermal resistivity 100 to 500 times higher than metals.

8. The method of claim 1 wherein the layer has a thickness of 0.5 mm or less.

9. Method for molding electronic components assembled on a leadframe to constitute a power supply, said method comprising:

sealing the surface of an inductor having high thermal capacitance with a polymeric layer having high thermal resistance, thus thermally insulating the inductor, the inductor including coated copper wires welded into magnetic ferrite material; and molding over the sealed surface to encapsulate the inductor and the electronic components assembled on a leadframe in a molding compound.

10. The method of claim 9 wherein the leadframe is a QFN/SON-type leadframe.

11. The method of claim 10 wherein the molding compound is an epoxy-based thermoset polymer with a high percentage of inorganic fillers.

\* \* \* \* \*